United States Patent
Wang et al.

(10) Patent No.: US 12,324,135 B2
(45) Date of Patent: Jun. 3, 2025

(54) ELECTROMAGNETIC SHIELDING MODULE, ELECTROMAGNETIC SHIELDING STRUCTURE AND CONSTRUCTION METHOD FOR THE ELECTROMAGNETIC SHIELDING STRUCTURE

(71) Applicant: Guangzhou Newlife New Material Co., LTD, Guangzhou (CN)

(72) Inventors: Xiaoming Wang, Guangzhou (CN); Bei Xu, Guangzhou (CN)

(73) Assignee: GUANGZHOU NEWLIFE NEW MATERIAL CO., LTD., Guangzhou (CN)

( * ) Notice: Subject to any disclaimer, the term of this patent is extended or adjusted under 35 U.S.C. 154(b) by 0 days.

(21) Appl. No.: 18/262,778

(22) PCT Filed: May 24, 2022

(86) PCT No.: PCT/CN2022/094694
§ 371 (c)(1),
(2) Date: Jul. 25, 2023

(87) PCT Pub. No.: WO2023/087651
PCT Pub. Date: May 25, 2023

(65) Prior Publication Data
US 2024/0431080 A1    Dec. 26, 2024

(30) Foreign Application Priority Data
Nov. 22, 2021    (CN) .......................... 202111386104.7

(51) Int. Cl.
*H05K 9/00*    (2006.01)
*E04B 1/92*    (2006.01)

(52) U.S. Cl.
CPC ............. *H05K 9/0003* (2013.01); *E04B 1/92* (2013.01); *H05K 9/0081* (2013.01); *E04B 2001/925* (2013.01)

(58) Field of Classification Search
CPC .................................................... H05K 9/0003
See application file for complete search history.

(56) References Cited

U.S. PATENT DOCUMENTS

| | | | |
|---|---|---|---|
| 5,098,009 A | | 3/1992 | Tsuchida et al. |
| 6,517,658 B1 | * | 2/2003 | Wageman ............ H05K 9/0015 156/247 |

(Continued)

FOREIGN PATENT DOCUMENTS

| | | |
|---|---|---|
| CN | 2162490 | 4/1994 |
| CN | 203238207 U | 10/2013 |

(Continued)

OTHER PUBLICATIONS

International Searching Authority. International Search Report and Written Opinion for PCT Application No. PCT/CN2022/094694 and English translation, mailed Jun. 29, 2022.

(Continued)

*Primary Examiner* — Hung V Ngo
(74) *Attorney, Agent, or Firm* — Vivacqua Crane, PLLC

(57) ABSTRACT

An electromagnetic shielding module, an electromagnetic shielding structure and a construction method for the electromagnetic shielding structure are disclosed. The electromagnetic shielding module includes a shielding layer and a first magnet layer, where the first magnet layer is bonded fixedly to the shielding layer. The electromagnetic shielding structure includes: a wall mounting structure, which includes a conductive frame and is arranged on a surface of a wall body to be shielded; and a plurality of the electromagnetic shielding modules mentioned above. The construction method is used for constructing the electromag- (Continued)

netic shielding modules on the wall body to form a continuous shielding body.

11 Claims, 3 Drawing Sheets

(56) References Cited

U.S. PATENT DOCUMENTS

| | | | |
|---|---|---|---|
| 2006/0186884 A1* | 8/2006 | Mallett | H05K 9/0003 |
| | | | 324/318 |
| 2009/0250575 A1 | 10/2009 | Fullerton et al. | |
| 2019/0124800 A1* | 4/2019 | Bodi | E04C 2/292 |
| 2019/0269045 A1 | 8/2019 | Carroll et al. | |
| 2019/0271163 A1 | 9/2019 | Wang | |
| 2024/0040758 A1* | 2/2024 | Shoda | B32B 27/08 |

FOREIGN PATENT DOCUMENTS

| | | |
|---|---|---|
| CN | 110042997 A | 7/2019 |
| CN | 110173069 A | 8/2019 |
| CN | 112854504 A | 5/2021 |
| CN | 114108857 A | 3/2022 |
| JP | H0983179 A | 3/1997 |
| JP | H09186485 | 7/1997 |
| JP | H1162048 A | 3/1999 |
| JP | 2004137823 A | 5/2004 |
| JP | 2005146689 A | 6/2005 |
| JP | 2005268597 A | 9/2005 |
| KR | 20060071631 A | 6/2006 |
| NL | 1031353 | 9/2007 |
| WO | 2016159688 A1 | 10/2016 |

OTHER PUBLICATIONS

The State Intellectual Property Office of People's Republic of China. First Office Action for CN Application No. 202111386104.7 and English translation, mailed Dec. 9, 2022, pp. 1-13.

The State Intellectual Property Office of People's Republic of China. First Search Report for CN Application No. 202111386104.7 and English translation, mailed Dec. 9, 2022, pp. 1-6.

* cited by examiner

ELECTROMAGNETIC SHIELDING MODULE, ELECTROMAGNETIC SHIELDING STRUCTURE AND CONSTRUCTION METHOD FOR THE ELECTROMAGNETIC SHIELDING STRUCTURE

CROSS-REFERENCE TO RELATED APPLICATIONS

This application is a national stage filing under 35 U.S.C. § 371 of international application number PCT/CN2022/094694, filed May 24, 2022, which claims priority to Chinese patent application No. 202111386104.7 filed Nov. 22, 2021. The contents of these applications are incorporated herein by reference in their entirety.

TECHNICAL FIELD

The present disclosure relates to the technical field of electromagnetic shielding, and in particular to an electromagnetic shielding module, an electromagnetic shielding structure and a construction method for the electromagnetic shielding structure.

BACKGROUND

With the rapid development of electronic technology, the environment is full of various electromagnetic waves, and electromagnetic pollution is becoming more and more serious, and even has a significant impact on human health. On the other hand, various electromagnetic compatibility tests also put forward various high requirements for the electromagnetic environment. In addition, more and more attention has been paid to information security issues, especially the secret-related departments need to prevent information leakage or system interference. In general, electromagnetic shielding requirements on people's life, scientific research work, military industry and other fields are getting higher and higher. For this reason, a continuous shielding body is usually formed by welding or screwing between metal plates, so as to achieve the effect of shielding the electromagnetic waves. During construction, it is easy to miss welding at a welding part, and there is also a gap at a screw joint, which needs to be filled with conductive materials. The above-mentioned methods all lead to extremely complicated construction and difficult subsequent disassembly.

SUMMARY

The present disclosure aims to solve one of the technical problems in the existing technology. Therefore, there is provided an electromagnetic shielding module, an electromagnetic shielding structure and a construction method for an electromagnetic shielding structure, which can improve the construction efficiency and the maintenance efficiency of an electromagnetic shielding room.

In a first aspect, embodiments of the present disclosure provide an electromagnetic shielding module, including:
 a shielding layer; and
 a first magnet layer, bonded to the shielding layer.

In a second aspect, embodiments of the present disclosure provide an electromagnetic shielding structure, including:
 a wall mounting structure, including a conductive frame that is arranged on a surface of a wall body to be shielded; and
 a plurality of the electromagnetic shielding modules according to any one of the embodiments in the first aspect, where the electromagnetic shielding modules are laid on the conductive frame fixedly by means of a magnetic attraction force between the first magnet layer and the wall mounting structure.

In a third aspect, embodiments of the present disclosure provide a construction method for an electromagnetic shielding structure, including:
 laying a wall mounting structure on a wall body to be shielded, where the wall mounting structure includes a conductive frame; and
 laying a plurality of the electromagnetic shielding modules according to any one of the embodiments in the first aspect fixedly by means of a magnetic attraction force between the corresponding first magnet layer and the wall mounting structure.

According to the above-mentioned embodiments of the present disclosure, at least the following beneficial effects are obtained. Since the first magnet layer is provided, by being magnetically fixed with the wall mounting structure by means of the magnetic force of the first magnet layer, the shielding layer can be fixed on the wall mounting structure. Each shielding layer is connected to the wall-mounted structure, so that the plurality of shielding layers located on the wall mounting structure are continuous conductively, thereby forming a continuous shielding body. Compared with the traditional welding/assembling construction method, conductive continuity is easier to be achieved according to the embodiments of the present disclosure. Moreover, compared with the traditional welding/assembling construction method, installation, disassembly and reinstallation of the electromagnetic shielding modules can be completed only by magnetic attraction and fixing, and the operation is simpler. Therefore, according to the electromagnetic shielding module, the electromagnetic shielding structure and the construction method for the electromagnetic shielding structure according to the embodiments of the present disclosure, the construction efficiency and the maintenance efficiency of the electromagnetic shielding room can be improved. Meanwhile, the electromagnetic shielding module and the electromagnetic shielding structure can be conveniently and directly constructed on the existing house wall, which occupies a small space, and overcomes the problem that traditional electromagnetic shielding requires an additional space to build a new shielding room.

Additional aspects and advantages of the present disclosure will be set forth, in part, from the following description, and in part will become apparent from the following description, or may be learned by practice of the present disclosure.

BRIEF DESCRIPTION OF DRAWINGS

The above-mentioned and/or additional aspects and advantages of the present disclosure will become apparent and readily understood from the following description of embodiments in conjunction with the accompanying drawings, wherein.

REFERENCE NUMERAL LISTING

Figure 1:
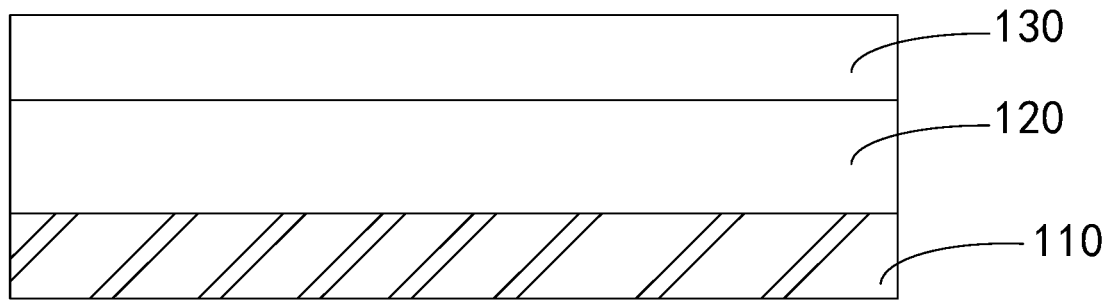
FIG. 1 is a schematic cross-sectional view of an electromagnetic shielding module according to an embodiment of the present disclosure.

Electromagnetic Shielding Module 100, Shielding Layer 110, First Magnet Layer 120, Decoration Layer 130, Third Magnet Layer 140, Conductive Frame 210, Iron Sheet 211, and Copper Mesh Strip 212.

DETAILED DESCRIPTION

The embodiments of the present disclosure will be described in detail below, and the examples of the embodiments are shown in the accompanying drawings, wherein throughout the same or similar reference numerals denote the same or similar elements or elements having the same or similar functions. The following embodiments described with reference to the accompanying drawings are exemplary and serve only to explain the present disclosure, and should not be construed as limiting the present disclosure.

In the description of the present disclosure, it should be understood that, descriptions relating to orientation, for example, orientation or positional relationships indicated by "up", "down", "front", "back", "left", "right", etc. are based on the orientation or positional relationships shown in the accompanying drawings, and are to facilitate the description of the present disclosure and simplify the description only, rather than indicating or implying that the device or element referred to must have a specific orientation or be constructed and operated in a specific orientation, and therefore cannot be construed as limiting the present disclosure. If there is a description to first and second, it is only for the purpose of distinguishing between technical features, and cannot be understood as indicating or implying relative importance or implicitly specifying the number of counting features indicated or implicitly specifying the sequence of the indicated technical features.

In the description of the present disclosure, unless explicitly defined otherwise, providing, installing, connecting and other words should be understood broadly, and a person of ordinary skill in the art can reasonably determine the specific meaning of the above words in the present disclosure combined with the specific content of the technical solution.

With the rapid development of electronic technology, the environment is full of various electromagnetic waves, and electromagnetic pollution is becoming more and more serious, and even has a significant impact on human health. On the other hand, various electromagnetic compatibility tests also put forward various high requirements for the electromagnetic environment. In addition, more and more attention has been paid to information security issues, especially the secret-related departments need to prevent information leakage or system interference. In general, electromagnetic shielding requirements on people's life, scientific research work, military industry and other fields are getting higher and higher. For this reason, a continuous shielding body is usually formed by welding or screwing between metal plates, so as to achieve the effect of shielding the electromagnetic waves. During construction, it is easy to miss welding at a welding part, and there is also a gap at a screw joint, which needs to be filled with conductive materials. The above-mentioned methods all lead to extremely complicated construction and difficult subsequent disassembly.

On this basis, the present disclosure provides an electromagnetic shielding module, an electromagnetic shielding structure and a construction method for the electromagnetic shielding structure, which can improve the construction efficiency and the maintenance efficiency of an electromagnetic shielding room.

The electromagnetic shielding module 100 of the embodiments of the present disclosure is described below with reference to the accompanying drawings. Referring to the embodiments shown in FIGS. 1-3, the electromagnetic shielding module 100 includes:

a shielding layer 110; and a first magnet layer 120, bonded to the shielding layer 110.

Therefore, since the first magnet layer 120 is provided, by being magnetically fixed with the wall mounting structure by means of the magnetic force of the first magnet layer 120, the shielding layer 110 can be fixed on the wall mounting structure. Each shielding layer 110 is connected to the wall-mounted structure, so that the plurality of shielding layers 110 located on the wall mounting structure are continuous conductively, thereby forming a continuous shielding body. Compared with the traditional welding/assembling construction method, conductive continuity is easier to be achieved according to the embodiments of the present disclosure. Moreover, compared with the traditional welding/assembling construction method, installation of the electromagnetic shielding modules 100 can be completed only by magnetic attraction and fixing, and the operation of installation and disassembly is simpler. Therefore, according to the electromagnetic shielding module 100, the electromagnetic shielding structure and the construction method for the electromagnetic shielding structure according to the embodiments of the present disclosure, the construction efficiency and the maintenance efficiency of an electromagnetic shielding room can be improved. Meanwhile, the electromagnetic shielding module can be conveniently and directly constructed on the existing house wall, which occupies a small space, and overcomes the problem that traditional electromagnetic shielding requires an additional space to build a new shielding room.

It should be noted that the shielding layer 110 is made of a material with a certain shielding effect and conductivity, such as a metal sheet, a metal mesh, conductive rubber, a composite material or the like.

It should be noted that the first magnet layer 120 and the shielding layer 110 are bonded by double-sided tape or the like. The first magnet layer 120 is made of a magnetic material, such as a sintered or bonded ferromagnetic material, or a rare earth ferromagnetic material, a ferrite ferromagnetic material, or a metal and alloy ferromagnetic material. It should be noted that, in the embodiments of the present disclosure, the shape of the first magnet layer 120 is not limited, and any shape that can function to fix the shielding layer 110 on the wall mounting structure should be included in the scope of the present disclosure. The shape of the first magnet layer 120 may be consistent with the structure of the shielding layer 110, or may be other shapes.

Figure 3:
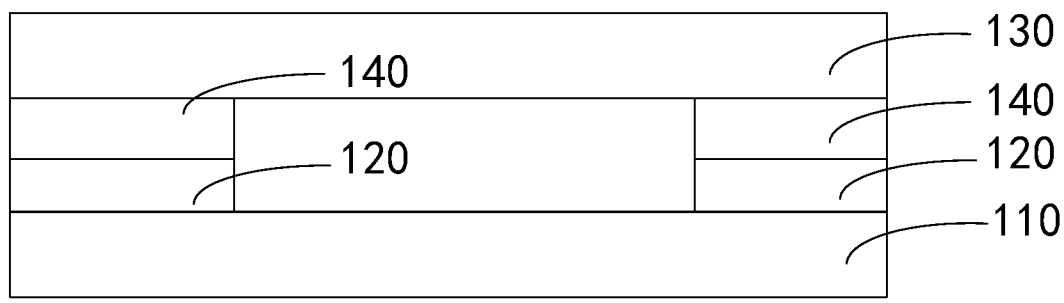
FIG. 3 is a schematic cross-sectional view of an electromagnetic shielding module according to another embodiment of the present disclosure.
Figure 4:
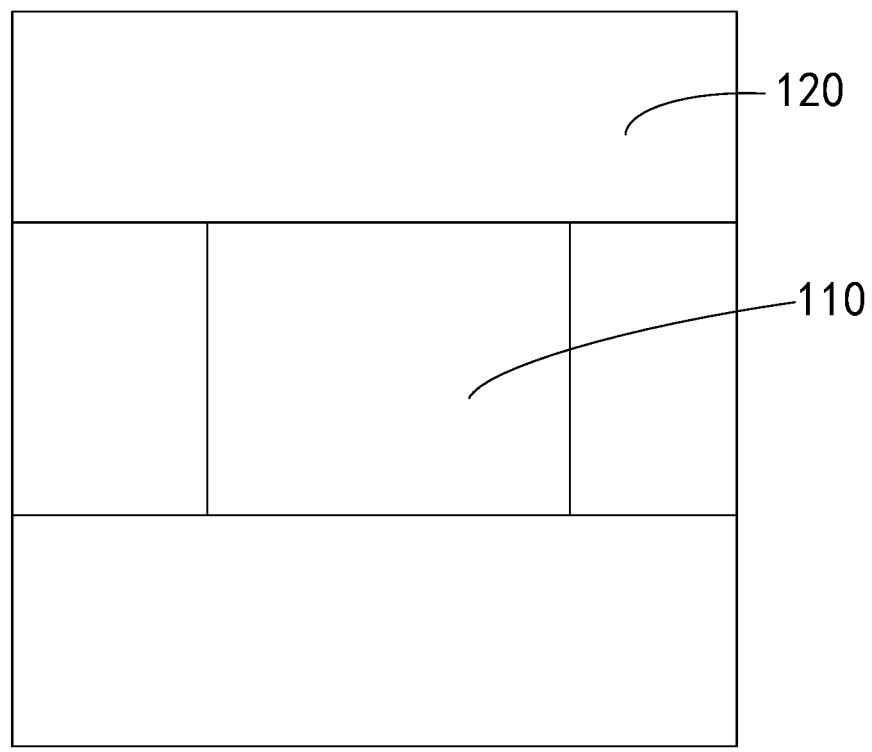
FIG. 4 is a schematic front view of an electromagnetic shielding module shown in FIG. 3 in the embodiment of the present disclosure.

In the embodiments shown in FIG. 3 and FIG. 4, the shielding layer 110 is provided with a magnetic material in the circumferential direction, and the magnetic material provided in the circumferential direction forms the first magnet layer 120. The first magnet layer 120 may be provided in a sheet shape with magnetism on one side, or a sheet shape with magnetism on both sides.

It should be noted that the wall mounting structure includes a conductive frame 210 made of a metal material and a second magnet layer. The conductive frame 210 is such as an iron sheet 211, a strip-shaped copper mesh, etc. The first magnet layer 120 can be attracted to the second magnet layer. In another embodiments, the wall mounting structure includes the magnetic conductive frame 210 made of the metal material, and the first magnet layer 120 can be attracted to the conductive frame 210.

Figure 2:
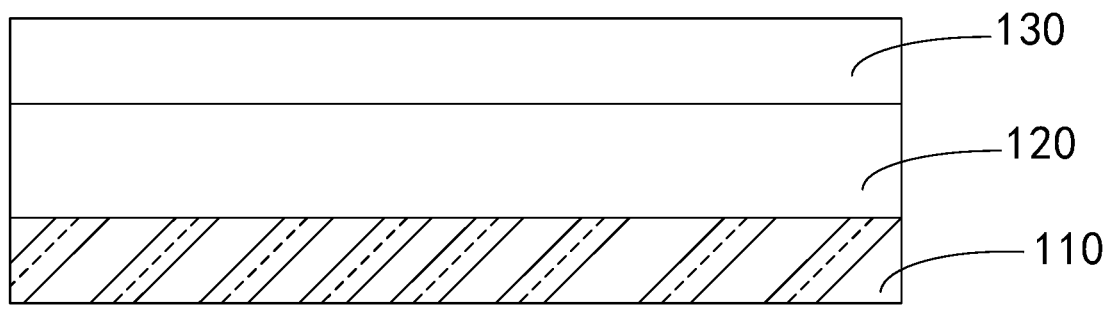
FIG. 2 is a schematic cross-sectional view of an electromagnetic shielding module according to another embodiment of the present disclosure.

Exemplarily, referring to the embodiment shown in FIG. 1, the shielding layer 110 is a copper mesh, and the first magnet layer 120 is an iron powder film; for another example, referring to the embodiment shown in FIG. 2, the shielding layer 110 is an aluminum foil, and the first magnet layer 120 is a soft magnetic ferrite plate. For another example, referring to the embodiment shown in FIG. 3, the shielding layer 110 is a conductive rubber layer, and the first magnet layer 120 is a rare earth bonded magnet.

It can be understood that the electromagnetic shielding module 100 further includes a decoration layer 130, which is arranged on one side, away from the shielding layer 110, of the first magnet layer 120.

It should be noted that, in order to improve the aesthetics or concealment of the electromagnetic shielding room, a decoration layer 130 may be provided, and the decoration layer 130 may be a decoration board or a PVC foam board, which may be fixed on the first magnet layer 120 in a magnetic attraction or bonding manner. For example, referring to the embodiment of FIG. 1, the decoration layer 130 is a PET printed layer, which is fixed on the first magnet layer 120 in the bonding manner, or fixed on the first magnet layer 120 in other detachable manners.

It can be understood that the decoration layer 130 is fixed to the first magnet layer 120 in the magnetic attraction or bonding manner.

It should be noted that it is easier to disassemble and install decoration layers by means of magnetic attraction. When a decoration layer is damaged, quick replacement can be achieved. The magnetic attraction method can be realized by magnetic attraction between the decoration layer 130 itself and the first magnet layer 120, or by adding a magnet layer, so that construction is simpler; and the magnetic attraction method makes easier disassembly than a welding or riveting method.

It can be understood that, referring to the embodiments shown in FIG. 2 and FIG. 3, the decoration layer 130 is a magnetic decoration layer 130; or a third magnet layer 140 that is magnetically attractable to the first magnet layer 120 is disposed on one side, facing the first magnet layer 120, of the decoration layer 130.

Exemplarily, referring to the embodiment shown in FIG. 3, the third magnet layer 140 is a rare earth bonded magnet, which is magnetically attracted to the first magnet layer 120, and the third magnet layer 140 is bonded to the PVC foam board. In this case, the third magnet layer 140 and the PVC foam board form a decoration layer 130 with the magnetic attraction capability.

Figure 5:
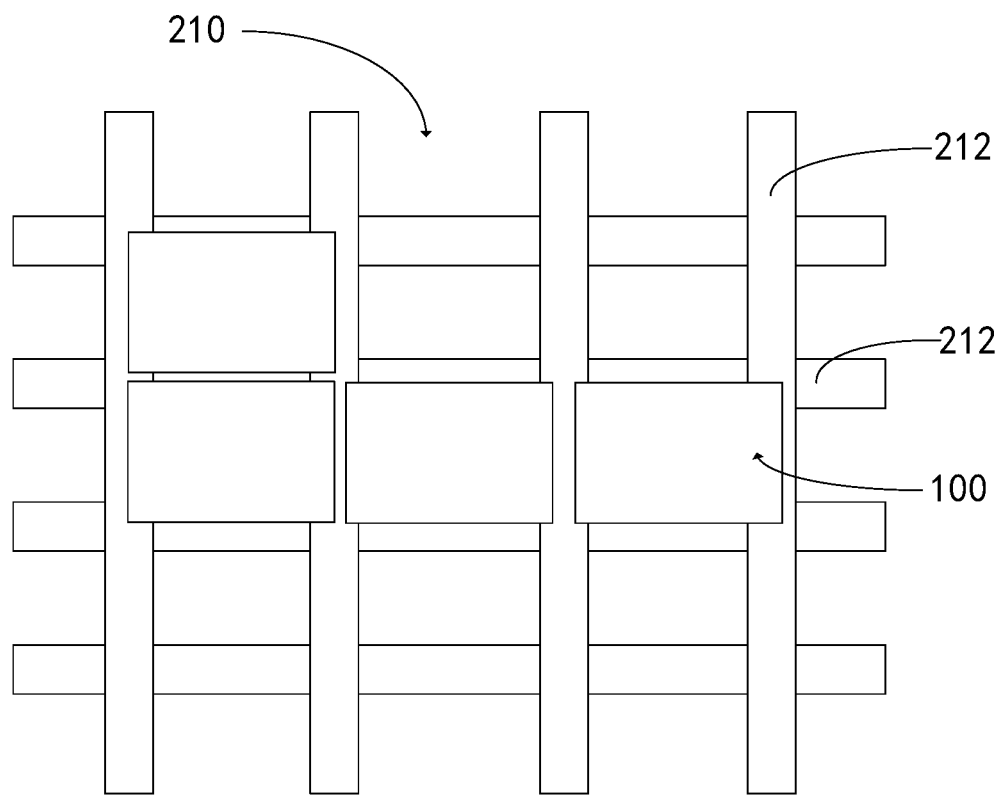
FIG. 5 is a partial structural schematic diagram of an electromagnetic shielding structure according to an embodiment of the present disclosure.
Figure 6:
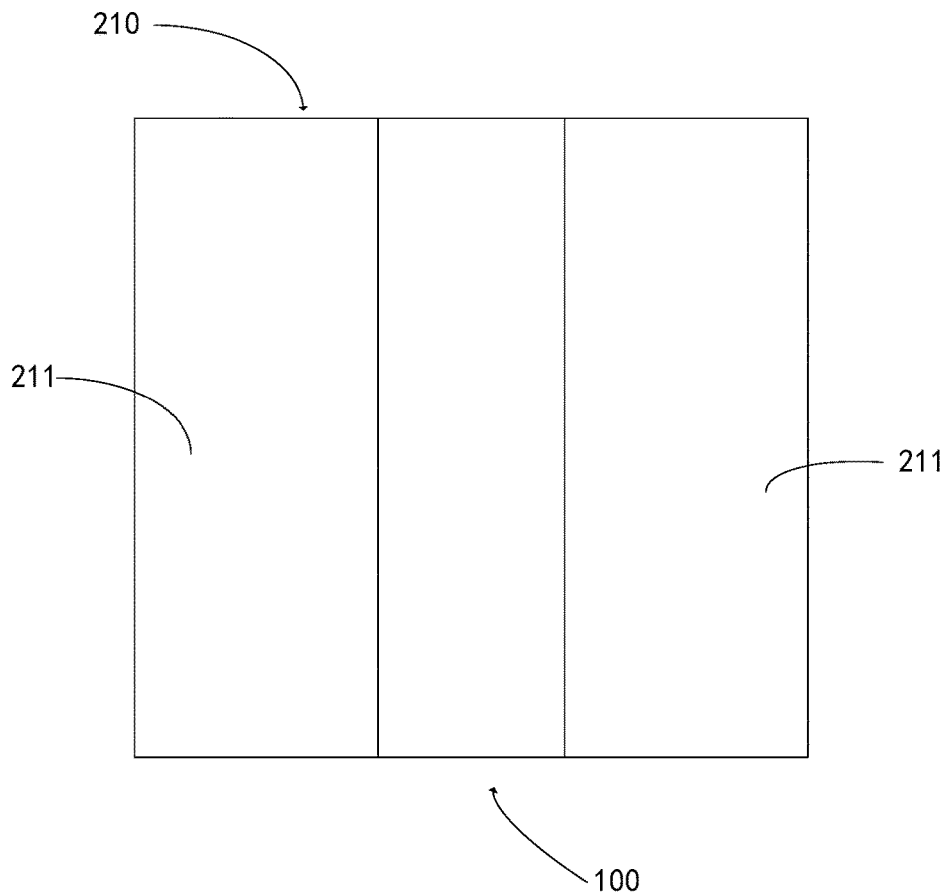
FIG. 6 is a partial structural schematic diagram of an electromagnetic shielding structure according to another embodiment of the present disclosure.
Figure 7:
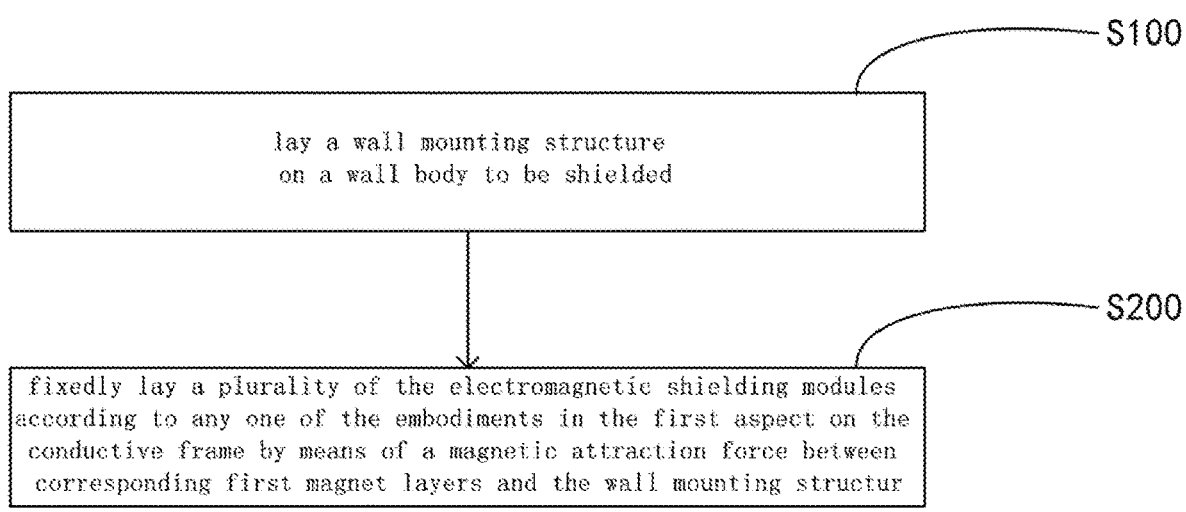
FIG. 7 is a schematic flowchart of a construction method for an electromagnetic shielding structure according to the embodiments of the present disclosure.

It can be understood that, referring to the embodiments shown in FIG. 5 to FIG. 6, the embodiments of the present disclosure further provide an electromagnetic shielding structure, including: a wall mounting structure and a plurality of electromagnetic shielding modules each of which is the electromagnetic shielding module 100 according to any one of the embodiments in the first aspect, where the wall mounting structure includes a conductive frame 210 and is arranged on the surface of a wall body to be shielded; and the electromagnetic shielding modules 100 are fixed by means of a magnetic attraction force between the first magnet layer 120 and the wall mounting structure and are then laid on the conductive frame 210.

It should be noted that the wall mounting structure is bonded to the wall body, and the wall mounting structure has magnetism and can be magnetically attracted to the first magnet layer 120. The wall mounting structure is also used for conducting electricity for the electromagnetic shielding modules 100, and every two adjacent electromagnetic shielding modules 100 are fixed by magnetic attraction and conducted by means of the conductive frame 210 located therebetween, thereby achieving continuous conduction.

Exemplarily, referring to the embodiment shown in FIG. 5, the wall mounting structure includes a conductive frame 210 and a magnetic rubber sheet. The conductive frame 210 is assembled or integrally formed from several copper mesh strips 212, and every two adjacent electromagnetic shielding modules 100 correspond to a copper mesh strip 212 and are fixed on the copper mesh strip 212. The conductive frame 210 is bonded to the magnetic rubber sheet, and the magnetic rubber sheet is magnetically attracted to the first magnet layer 120. For another example, referring to the embodiment shown in FIG. 6, the wall mounting structure includes iron sheets 211 arranged at intervals, and both sides of each electromagnetic shielding module 100 are magnetically connected to the surfaces of two iron sheets 211 respectively, and cover above the gap between two adjacent iron sheets 211. In this case, under the action of a magnetic force, the electromagnetic shielding modules 100 can conduct electricity continuously with the wall mounting structure, thereby forming a continuous shielding body. Compared with the traditional construction process, which causes gaps and affects the shielding effect, the electromagnetic shielding structure according to the embodiments of the present disclosure has better shielding effect, and by using a magnetic attraction method, easier fixing can be achieved. In addition, the electromagnetic shielding structure according to the embodiments of the present disclosure can facilitate direct construction on the existing house wall, which occupies a small space, and overcomes the problem that traditional electromagnetic shielding requires an additional space to build a new shielding room.

It can be understood that the conductive frame 210 includes several conductive parts, and there is a corresponding conductive part between any two adjacent electromagnetic shielding modules 100, and this conductive part is attached with the two adjacent electromagnetic shielding modules 100.

Exemplarily, the conductive parts may be copper mesh strips 212 as shown in FIG. 5 or aluminum foils, or iron sheets as shown in FIG. 6.

It can be understood that the conductive frame 210 is magnetically attracted to the first magnet layer 120.

It should be noted that, in the wall mounting structure, the conductive frame 210 is fixed to the surface of the wall body by magnetic attraction, bonding, screwing, riveting and other methods; and the conductive frame 210 and the first magnet layer 120 are magnetically attracted to each other and achieve continuous conduction.

It can be understood that the wall mounting structure further includes a second magnet layer, which is laid on the surface of the wall body, and the first magnet layer 120 is magnetically attracted to the second magnet layer.

It should be noted that the second magnet layer may be a magnetic rubber sheet, or the second magnet layer may be obtained by painting the inner side wall or the outer side wall of the wall body with a magnetic material. The second magnet layer may cover the entire wall, and may also be attached at a position that needs to be fixed. The second magnet layer and the first magnet layer 120 are magnetically attracted to each other, so that the electromagnetic shielding modules 100 can be fixed on the conductive frame 210 by means of attraction between the second magnet layer and the first magnet layer 120. The conductive frame 210 may be assembled by several conductive parts, or may be an integrally formed conductive frame 210.

It can be understood that the conductive frame 210 is magnetically attracted to the second magnet layer. Through magnetic attraction between the conductive frame 210 and the second magnet layer, the conductive frame 210 can be more conveniently fixed between the shielding layer 110 of the electromagnetic shielding modules 100 and the second magnet layer.

Exemplarily, in some embodiments, a plurality of strip-shaped aluminum foils and thin iron powder films are composited to form a conductive frame 210 that can attract the second magnet layer. In other embodiments, referring to the embodiment shown in FIG. 6, the conductive frame 210 includes a plurality of iron sheets 211, so as to be magnetically attracted by the second magnet layer.

It can be understood that the present disclosure also provides a construction method for the electromagnetic shielding structure, the method including:

Step S100: laying a wall mounting structure on a wall body to be shielded, where the wall mounting structure includes a conductive frame 210.

It should be noted that the wall mounting structure may be assembled on the wall body, or may be directly installed on the wall body after being assembled. The wall mounting structure may be fixed in a bonding manner, or fixed to the wall body in a magnetic attraction manner.

Step S200: fixedly laying a plurality of the electromagnetic shielding modules 100 according to any one of the embodiments in the first aspect on the conductive frame by means of a magnetic attraction force between first magnet layers and the wall mounting structure.

It can be understood that the conductive frame in step S100 is magnetically attracted to the first magnet layer 120.

It can be understood that the wall mounting structure includes a second magnet layer and a conductive frame; and step S100 includes: laying the second magnet layer on the surface of the wall body; and assembling several conductive parts on the second magnet layer to form a conductive frame 210.

It should be noted that the conductive parts may be in a strip shape or a sheet shape, such as the copper mesh strips 212 shown in FIG. 5 or the iron sheets 211 shown in FIG. 6. The conductive parts of a mesh-shape or a spaced and sheet shape are assembled on the second magnet layer as required, and then each electromagnetic shielding module 100 is fixed on two adjacent conductive parts by using the first magnet layer 120 to form a continuous shield body.

It should be noted that the second magnet layer may be a magnetic rubber sheet, or the second magnet layer may be obtained by painting the inner side wall or the outer side wall of the wall body with a magnetic material.

It should be noted that, for the wall body, a door is also provided, and an electromagnetic shielding door may be installed at the position of the door.

Exemplarily, referring to the embodiments shown in FIGS. 1-3 and FIG. 5, in some embodiments, the shielding layer 110 of the electromagnetic shielding modules 100 is a shielding copper mesh, the first magnet layer 120 is an iron powder film, and the decoration layer 130 is a PET printed layer. The PET printed layer and the shielding copper mesh are respectively bonded fixedly to both surfaces of the first magnet layer 120. The wall mounting structure includes a second magnet layer and a conductive frame 210. The second magnet layer is a magnetic rubber sheet, and the conductive frame 210 is a strip-shaped copper mesh. The magnetic rubber sheet is bonded to the wall body, and the strip-shaped copper mesh is bonded to the magnetic rubber sheet. The electromagnetic shielding modules 100 are magnetically attracted to the magnetic rubber sheet by means of the first magnet layer 120, and are attached with the strip-shaped copper mesh. In other embodiments, the shielding layer 110 of the electromagnetic shielding modules 100 is a shielding aluminum foil, the first magnet layer 120 is a soft magnetic ferrite plate, and the decoration layer 130 is a magnetic decoration paper. The magnetic decoration paper is attracted to the first magnet layer 120, and the shielding aluminum foil is bonded to the first magnet layer 120. The wall mounting structure includes a second magnet layer and a conductive frame 210. The second magnet layer is a magnetic rubber sheet, and the conductive frame 210 is made of a composite material of the strip-shaped aluminum foil and thin iron powder film. The conductive frame 210 is magnetically attracted to the magnetic rubber sheet, and the first magnet layer 120 is attracted to the second magnet layer and is bonded to the conductive frame 210. In other embodiments, the shielding layer 110 of the electromagnetic shielding modules 100 is a shielding conductive rubber layer, the first magnet layer 120 is a rare earth bonding layer, and the decoration layer 130 is a PVC foam board. The rare earth bonding layer is provided on the third decoration layer 130 close to the first magnet layer 120, the third decoration layer 130 and the first magnet layer 120 are disposed opposite to each other and are magnetically attracted to each other, the conductive frame 210 is strip-shaped conductive rubber, which is bonded to the second magnet layer, and the electromagnetic shielding modules 100 and the second magnet layer are fixed in a magnetic attraction manner and are attached with the strip-shaped conductive rubber.

To sum up, the electromagnetic shielding module 100, the electromagnetic shielding structure and the construction method according to the embodiments of the present disclosure can be used for refitting the existing wall body. By performing Step S100 on the existing wall body, i.e., by laying the second magnet layer and assembling a plurality of conductive parts along the outer side wall of the wall body, the structure shown in FIG. 4 or FIG. 5 can be formed, and then the electromagnetic shielding modules 100 are arranged between every two adjacent conductive parts respectively, so that the edges of each of electromagnetic shielding modules 100 are all attached to the conductive parts and are magnetically fixed by the second magnet layer or the conductive frame 210, thereby covering the entire wall with a continuous shielding body formed by the electromagnetic shielding modules 100 and the wall mounting structure. Using the electromagnetic shielding modules 100 according to the embodiments of the present disclosure, modification can be made based on the existing wall with low cost, and the electromagnetic shielding modules 100 can be fixed to the wall body in the magnetic attraction manner, which is convenient for installation. When electromagnetic shielding is not required, the electromagnetic shielding modules 100 and the wall mounting structure can be more quickly disassembled, thereby improving the convenience of installation and disassembly. It should be noted that, in some embodiments, since the structures used for electromagnetic shielding are all detachable, it is easier to transport, thereby reducing the transport cost. Meanwhile, the electromagnetic shielding modules and the electromagnetic shielding structure can be conveniently and directly constructed on the existing house wall, which occupies a small space, and overcomes the problem that traditional electromagnetic shielding requires an additional space to build a new shielding room.

In the description of the present specification, description referring to the terms such as "an embodiment", "some embodiments", "illustrative embodiments", "other embodiments", "another embodiment", "examples", "specific examples", "exemplarily" or "some examples" implies that specific characteristics, structures, materials or features described in conjunction with the embodiments or examples are included in a plurality of embodiments or examples of the present disclosure. In the present specification, the schematic expression of the above terms does not necessarily refer to the same embodiment or example. Moreover, the specific characteristics, structures, materials or features described can be combined in any one or more embodiments or examples in a suitable manner.

Although the embodiments of the present disclosure have been shown and described, it will be understood by those of ordinary skill in the art that various changes, modifications, substitutions and alterations can be made to these embodiments without departing from the principles and gist of the present disclosure. The scope of the present disclosure is defined by the claims and their equivalents.

The embodiments of the present disclosure have been described in detail above in conjunction with the accompanying drawings, but the present disclosure is not limited to the above-mentioned embodiments, and various changes can also be made within the scope of knowledge possessed by those of ordinary skill in the art without departing from the purpose of the present disclosure.

What is claimed is:

1. An electromagnetic shielding structure, comprising:
a wall mounting structure, comprising a conductive frame and arranged on a surface of a wall body to be shielded; and
a plurality of electromagnetic shielding modules, wherein the electromagnetic shielding modules comprises:
a shielding layer,
a first magnet layer bonded fixedly to the shielding layer, and
wherein the electromagnetic shielding modules are laid on the conductive frame fixedly by means of a magnetic attraction force between the first magnet layer and the wall mounting structure;
wherein the conductive frame comprises several conductive parts, and a corresponding one of the conductive parts is provided between any two adjacent electromagnetic shielding modules, and is attached with the two adjacent electromagnetic shielding modules.

2. The electromagnetic shielding structure according to claim 1, wherein the conductive frame is magnetically attracted to the first magnet layer.

3. The electromagnetic shielding structure according to claim 1, wherein the wall mounting structure further comprises a second magnet layer, which is laid on the surface of the wall body, and the first magnet layer is magnetically attracted to the second magnet layer.

4. The electromagnetic shielding structure according to claim 3, wherein the conductive frame is magnetically attracted to the second magnet layer.

5. The electromagnetic shielding structure according to claim 1, wherein the electromagnetic shielding modules further comprises a decoration layer arranged on one side, away from the shielding layer, of the first magnet layer.

6. The electromagnetic shielding structure according to claim 5, wherein the decoration layer is fixed to the first magnet layer in a magnetic attraction or bonding manner.

7. The electromagnetic shielding structure according to claim 6, wherein the decoration layer is a magnetic decoration layer, or a third magnet layer that is magnetically attractable to the first magnet layer is disposed on one side, facing the first magnet layer, of the decoration layer.

8. The electromagnetic shielding structure according to claim 1, wherein the shielding layer is provided with a magnetic material in circumferential direction.

9. A construction method for an electromagnetic shielding structure, comprising:
laying a wall mounting structure on a wall body to be shielded, wherein the wall mounting structure comprises a conductive frame; and
laying a plurality of electromagnetic shielding modules on the conductive frame fixedly by means of a magnetic attraction force between the corresponding first magnet layer and the wall mounting structure, wherein the electromagnetic shielding modules comprises:
a shielding layer,
a first magnet layer bonded fixedly to the shielding layer, and
wherein the conductive frame comprises several conductive parts, and a corresponding one of the conductive parts is provided between any two adjacent electromagnetic shielding modules, and is attached with the two adjacent electromagnetic shielding modules.

10. The construction method according to claim 9, wherein the conductive frame is magnetically attracted to the first magnet layer.

11. The construction method according to claim 9, wherein the wall mounting structure further comprises a second magnet layer; and
laying the wall mounting structure on the wall body to be shielded comprises:
laying the second magnet layer on a surface of the wall body; and
assembling several conductive parts on the second magnet layer to form the conductive frame.

* * * * *